(12) United States Patent
Baniecki et al.

(10) Patent No.: US 10,103,308 B2
(45) Date of Patent: Oct. 16, 2018

(54) THERMOELECTRIC CONVERSION ELEMENT AND METHOD FOR PRODUCING THE SAME

(71) Applicant: FUJITSU LIMITED, Kawasaki-shi, Kanagawa (JP)

(72) Inventors: John David Baniecki, Zama (JP); Takashi Yamazaki, Kawasaki (JP); Hiroyuki Aso, Atsugi (JP); Yoshihiko Imanaka, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 9 days.

(21) Appl. No.: 15/290,407

(22) Filed: Oct. 11, 2016

(65) Prior Publication Data

US 2017/0104145 A1    Apr. 13, 2017

(30) Foreign Application Priority Data

Oct. 13, 2015    (JP) ................................. 2015-202307

(51) Int. Cl.
  *H01L 35/22* (2006.01)
  *H01L 35/32* (2006.01)
  *H01L 35/34* (2006.01)

(52) U.S. Cl.
  CPC .............. *H01L 35/22* (2013.01); *H01L 35/32* (2013.01); *H01L 35/34* (2013.01)

(58) Field of Classification Search
  CPC .......................................... H01L 35/00–35/34
  USPC ................................................. 136/200–242
  See application file for complete search history.

(56) References Cited

U.S. PATENT DOCUMENTS

| 4,938,244 A * | 7/1990 | Kumada | H01L 35/08 136/212 |
| 2008/0295879 A1* | 12/2008 | Atanackovic | H01L 35/22 136/238 |
| 2009/0107535 A1* | 4/2009 | Hu | F23C 99/00 136/201 |
| 2012/0090657 A1* | 4/2012 | Lee | H01L 35/22 136/205 |
| 2013/0306124 A1* | 11/2013 | Yajima | H01L 35/32 136/205 |
| 2014/0264459 A1* | 9/2014 | Choi | H01L 29/045 257/201 |
| 2015/0053247 A1* | 2/2015 | Baniecki | H01L 35/22 136/205 |

FOREIGN PATENT DOCUMENTS

| JP | 2006-024632 A1 | 1/2006 | |
| JP | 2006-179807 A1 | 7/2006 | |
| WO | WO 2013171834 A1 * | 11/2013 | ............. H01L 35/22 |

* cited by examiner

*Primary Examiner* — Liesl C Baumann
(74) *Attorney, Agent, or Firm* — Kratz, Quintos & Hanson, LLP

(57) ABSTRACT

A thermoelectric conversion element includes a p-type film having a perovskite structure, the p-type film including Co; an n-type film having a perovskite structure, the n-type film including Ti; first and second i-type films configured to be arranged to face each other across the n-type film, the first and second i-type films having a perovskite structure and including Ti; and a barrier film configured to be interposed between a multilayer body and the p-type film, the barrier film having a perovskite structure and including Zr, the multilayer body including the n-type film and the first and second i-type films.

20 Claims, 4 Drawing Sheets

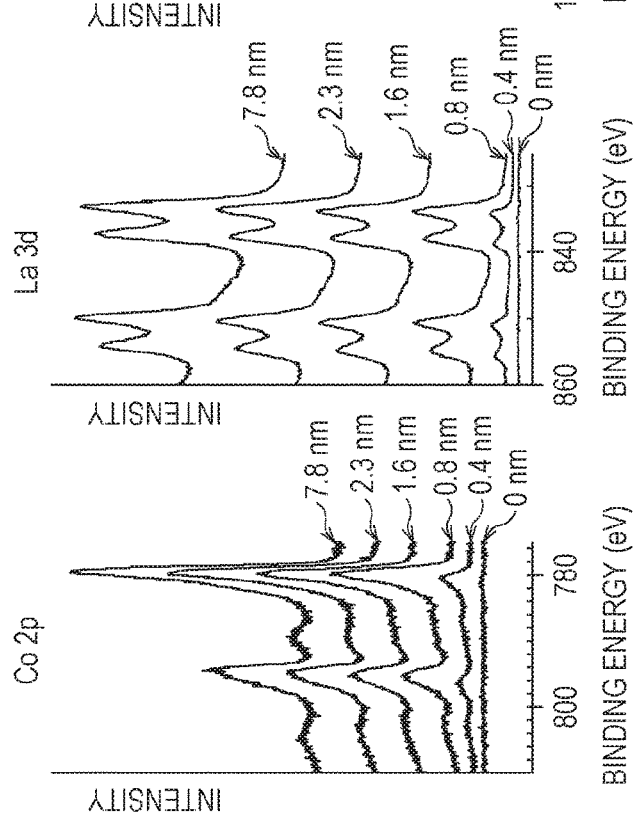
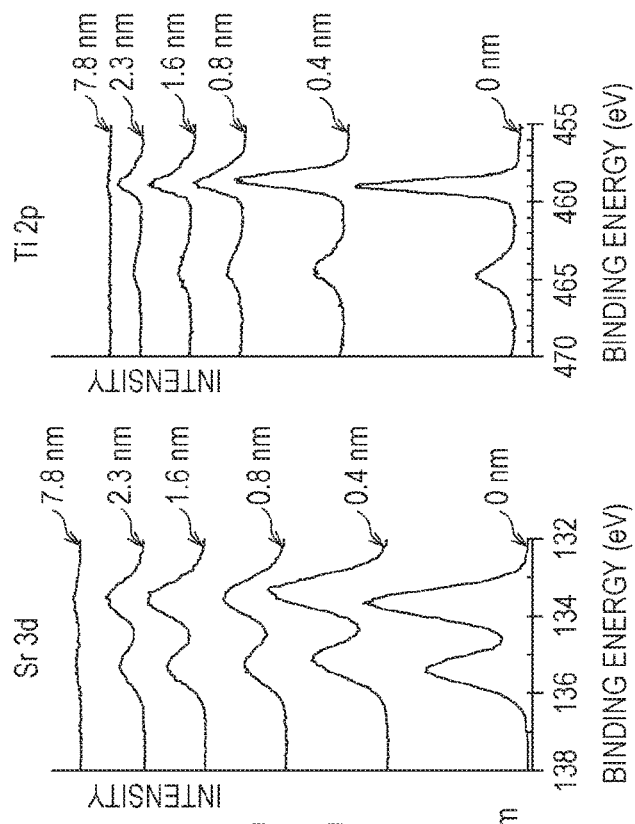
FIG. 4A  FIG. 4B  FIG. 4C  FIG. 4D

THERMOELECTRIC CONVERSION ELEMENT AND METHOD FOR PRODUCING THE SAME

CROSS-REFERENCE TO RELATED APPLICATION

This application is based upon and claims the benefit of priority of the prior Japanese Patent Application No. 2015-202307, filed on Oct. 13, 2015, the entire contents of which are incorporated herein by reference.

FIELD

The embodiments discussed herein are related to a thermoelectric conversion element, a method for producing the thermoelectric conversion element, and the like.

BACKGROUND

Attention has been focused on thermoelectric conversion elements, which are clean power generation systems, from the viewpoint of a reduction in carbon dioxide ($CO_2$) emission and environmental protection. Use of thermoelectric conversion elements enables thermal energy, which has previously been exhausted, to be converted into electric energy and reused.

There may be room for increasing the thermoelectric efficiency of thermoelectric conversion elements.

Japanese Laid-open Patent Publication Nos. 2006-179807 and 2006-24632 disclose the related art.

Accordingly, it is desired to provide a thermoelectric conversion element, a method for producing the thermoelectric conversion element, and the like that have an increased thermoelectric efficiency.

SUMMARY

According to an aspect of the invention, a thermoelectric conversion element includes a p-type film having a perovskite structure, the p-type film including Co; an n-type film having a perovskite structure, the n-type film including Ti; first and second i-type films configured to be arranged to face each other across the n-type film, the first and second i-type films having a perovskite structure and including Ti; and a barrier film configured to be interposed between a multilayer body and the p-type film, the barrier film having a perovskite structure and including Zr, the multilayer body including the n-type film and the first and second i-type films.

According to another aspect of the invention, a method for producing a thermoelectric conversion element, the method includes: forming a p-type film having a perovskite structure, the p-type film including Co; forming an n-type film having a perovskite structure, the n-type film including Ti; forming first and second i-type films having a perovskite structure, the first and second i-type films including Ti and being arranged to face each other across the n-type film; and forming a barrier film configured to be interposed between a multilayer body and the p-type film, the barrier film having a perovskite structure and including Zr, the multilayer body including the n-type film and the first and second i-type films.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A to 4D are diagrams illustrating the results of XPS analysis.

DESCRIPTION OF EMBODIMENTS

The embodiments are specifically described below with reference to the attached drawings.

First Embodiment

Figure 1:
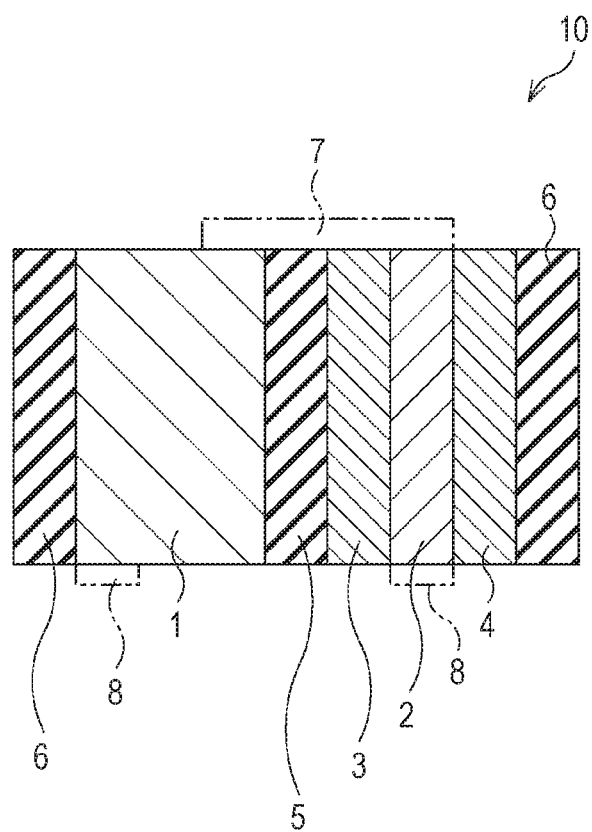
FIG. 1 is a cross-sectional view of a thermoelectric conversion element according to a first embodiment.

The first embodiment is described below. There is described an example of a thermoelectric conversion element as the first embodiment. FIG. 1 is a cross-sectional view of a thermoelectric conversion element according to the first embodiment.

A thermoelectric conversion element 10 according to the first embodiment includes a p-type film 1, an n-type film 2, and i-type films 3 and 4. The i-type films 3 and 4 are arranged to face each other across the n-type film 2 as illustrated in FIG. 1. The i-type film 3 is interposed between the p-type film 1 and the n-type film 2. The thermoelectric conversion element 10 also includes a barrier film 5 interposed between the p-type film 1 and the i-type film 3. A multilayer body including the p-type film 1, the barrier film 5, the i-type film 3, the n-type film 2, and the i-type film 4 is interposed between a pair of barrier films 6. One of the barrier films 6 is arranged to face the barrier film 5 across the p-type film 1, and the other barrier film 6 is arranged to face the n-type film 2 across the i-type film 4.

The p-type film 1 has a perovskite structure and includes Co. The thickness of the p-type film 1 is preferably 100 to 10,000 nm in order to achieve a sufficient amount of current. The n-type film 2 and the i-type films 3 and 4 have a perovskite structure and include Ti. The thickness of the n-type film 2 is preferably 10 nm or more in order to achieve a sufficient amount of current. The thickness of the n-type film 2 is preferably 100 nm or less in order to reduce the influence of electrons migrating from the n-type film 2 into the i-type films 3 and 4. The thicknesses of the i-type films 3 and 4 are preferably 1 to 5 nm in order to reduce the influence of electrons migrating from the n-type film 2 into the i-type films 3 and 4. The barrier films 5 and 6 have a perovskite structure and include Zr. The thicknesses of the barrier films 5 and 6 are preferably 5 nm or more in order to achieve an appropriate degree of insulating capability. However, the insulating capability of the barrier films 5 and 6 stops increasing when the thicknesses of the barrier films 5 and 6 reach about 100 nm, and setting the thicknesses of the barrier films 5 and 6 to be more than 100 nm only increases the cost. Thus, the thicknesses of the barrier films 5 and 6 are preferably 100 nm or less. The p-type film 1 is a p-type $LaCoO_3$ film or the like. The n-type film 2 is an n-type $Sr_{0.95}La_{0.05}TiO_3$ film or the like. The i-type films 3 and 4 are, for example, SrTiO₃ films that are not intentionally doped with impurities. The barrier films 5 and 6 are SrZrO₃ films or the like.

Figure 2A:
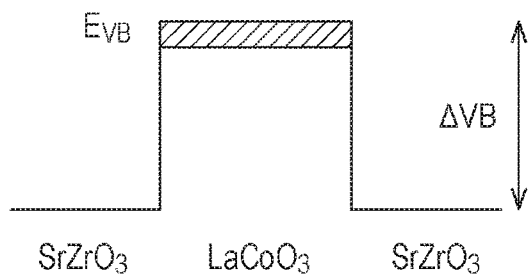
FIGS. 2A to 2C are band diagrams illustrating the energies of $LaCoO_3$ and $SrZrO_3$.
Figure 2B:
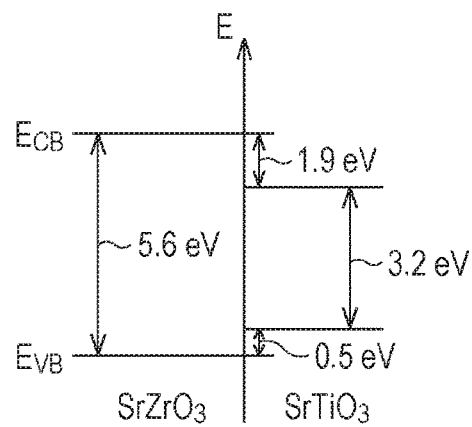
Figure 2C:
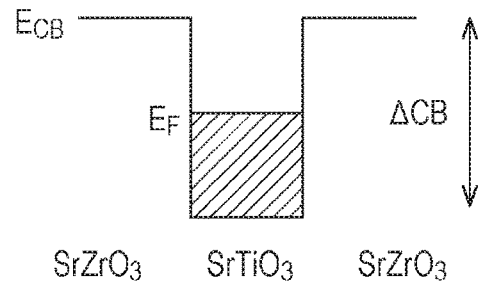

The p-type film 1 is interposed between the barrier films 5 and 6. There is a difference (ΔVB) in the energy of the valence band between LaCoO₃ and SrZrO₃ as illustrated in FIG. 2A. ΔVB is 3.5 eV. The i-type film 3, the n-type film 2, and the i-type film 4 are interposed between the barrier films 5 and 6. There is a difference (ΔCB) in the energy of the conduction band between SrTiO₃ and SrZrO₃ as illustrated in FIGS. 2B and 2C. ΔCB is 1.9 eV. The conduction band of $Sr_{0.95}La_{0.05}TiO_3$ is considered to be equivalent to that of SrTiO₃.

In the thermoelectric conversion element 10, for example, the p-type film 1 and the n-type film 2 are electrically coupled to each other with a conductive film 7, and a conductive film 8 is arranged to come into contact with the p-type film 1 and the n-type film 2 on a side of the thermoelectric conversion element 10 which is opposite to the side on which the conductive film 7 is present. In this case, the difference in temperature between the vicinity of the conductive film 7 and the vicinity of the conductive film 8 creates a voltage, which is output from the conductive film 8. Since the difference (ΔVB) in the energy of the valence band is 3.5 eV in the first embodiment, the p-type film 1 serves as a p-type quantum well. This enables quantum confinement to be achieved and may increase a figure of merit (ZT), which is a measure of thermoelectric efficiency.

The thermoelectric conversion element 10 may be produced by, for example, forming the barrier film 6, the p-type film 1, the barrier film 5, the i-type film 3, the n-type film 2, the i-type film 4, and the barrier film 6 on and above a substrate in this order. The above films may be formed in inverse order. The substrate may be $(LaAlO_3)_{0.3}$—$(SrAl_{0.5}Ta_{0.5}O_3)_{0.7}$, which is a LSAT substrate, or the like. For forming the barrier film 6, the p-type film 1, the barrier film 5, the i-type film 3, the n-type film 2, the i-type film 4, and the barrier film 6, for example, pulsed laser deposition (PLD) may be employed. In PLD process, for example, a Q-switched Nd:YAG laser is used, the pulse rate is set to 10 Hz, and the interval between the substrate and a target is set to 5 cm. For forming the barrier film 6, the p-type film 1, the barrier film 5, the i-type film 3, the n-type film 2, the i-type film 4, and the barrier film 6, alternatively, RF magnetron sputtering may be employed.

Second Embodiment

Figure 3:
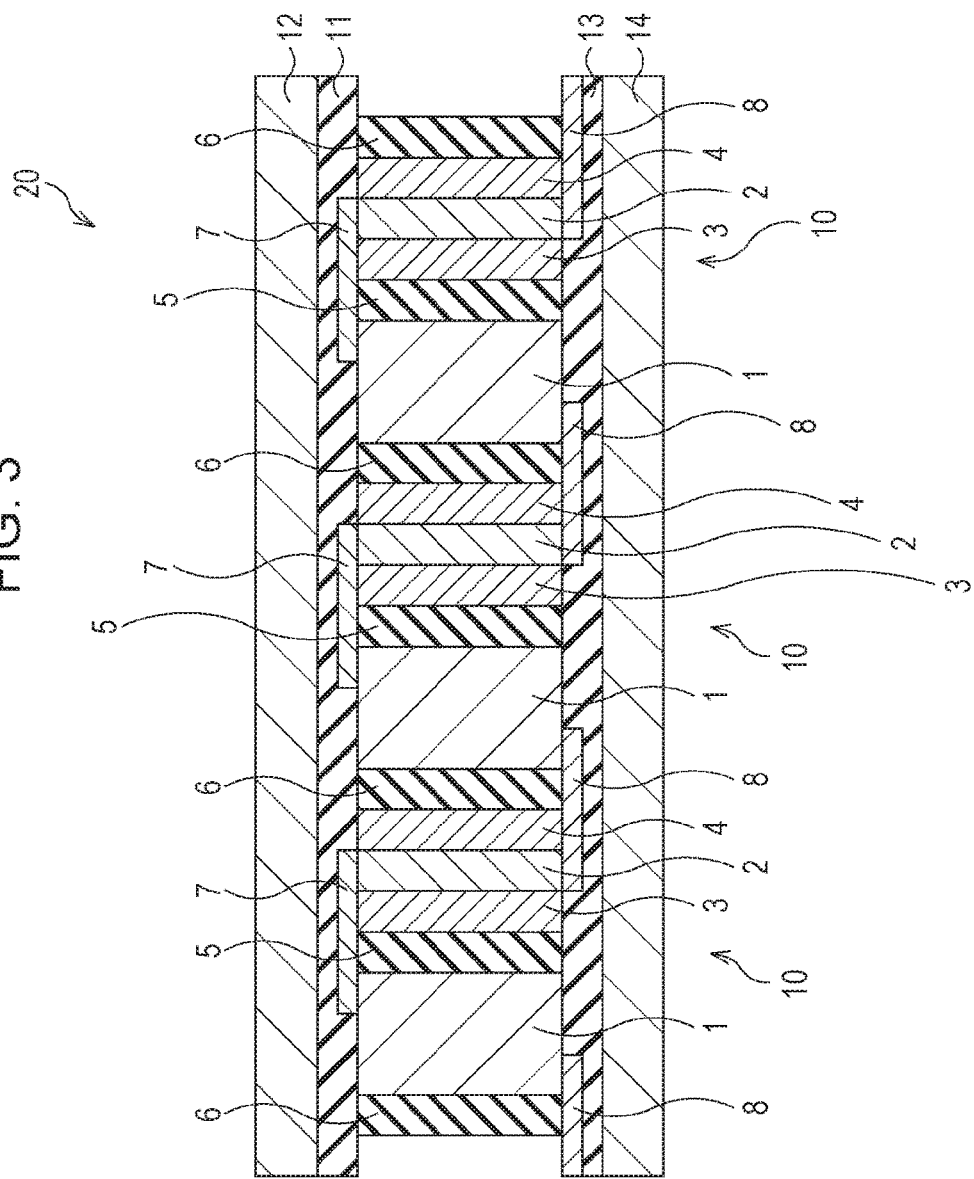
FIG. 3 is a cross-sectional view of a thermoelectric conversion apparatus according to a second embodiment.

The second embodiment is described below. In the second embodiment, an example of a thermoelectric conversion apparatus is described. FIG. 3 is a cross-sectional view of the thermoelectric conversion apparatus according to the second embodiment.

A thermoelectric conversion apparatus 20 according to the second embodiment includes three thermoelectric conversion elements 10 that are stacked on top of one another as illustrated in FIG. 3. Each of the pairs of the adjoining thermoelectric conversion elements 10 share the barrier film 6 interposed therebetween. The p-type film 1 and the n-type film 2 included in each of the thermoelectric conversion elements 10 are electrically coupled to each other with the corresponding one of conductive films 7. The p-type film 1 included in one of the thermoelectric conversion elements 10 is electrically coupled to the n-type film 2 of the adjoining one of the thermoelectric conversion elements 10 with the corresponding one of conductive films 8. A heat sink 12 is disposed on a side of the thermoelectric conversion apparatus 20 on which the conductive films 7 are present. A heat sink 14 is disposed on a side of the thermoelectric conversion apparatus 20 on which the conductive films 8 are present. A protective film 11 is interposed between the heat sink 12 and the conductive film 7. A protective film 13 is interposed between the heat sink 14 and the conductive film 8.

In the thermoelectric conversion apparatus 20, the difference in temperature between the heat sinks 12 and 14 creates a voltage, which is output from the conductive films 8 disposed at the respective ends of the thermoelectric conversion apparatus 20. Since the difference (ΔVB) in the energy of the valence band is 3.5 eV in the second embodiment, the p-type films 1 serve as p-type quantum wells. This may increase the thermoelectric efficiency of the thermoelectric conversion apparatus.

A test conducted by the inventors of the present application is described below. In this test, a LaCoO₃ film was formed on a SrTiO₃ substrate doped with Nb (1 mass %) by PLD. For performing ablation, a Q-switched Nd:YAG laser was used, the pulse rate was set to 10 Hz, and the interval between the substrate and a target was set to 5 cm. The target used was a polycrystalline LaCoO₃ target having a stoichiometric composition. While the LaCoO₃ film was formed, X-ray photoelectron spectroscopy (XPS) analysis was conducted on site. FIGS. 4A to 4D illustrate the results. Peaks other than the peaks resulting from the SrTiO₃ substrate or the LaCoO₃ film were not observed.

As illustrated in FIGS. 4C and 4D, the larger the thickness of the LaCoO₃ film, the larger the attenuation of the peak of each of the core levels (Sr 3d and Ti 2p) of Sr and Ti constituting the SrTiO₃ substrate. This confirms that the LaCoO₃ film had grown in the Frank-van der Merwe growth mode.

As illustrated in FIGS. 4A to 4D, the larger the thickness of the LaCoO₃ film, the larger the shift of the peak of each of the core levels (La 3d, Co 2p, Sr 3d, and Ti 2p) of La, Co, Sr, and Ti in the direction in which the binding energy decreases.

The results of the above analysis and ultraviolet photoelectron spectroscopy (UPS) analysis confirm that the difference in the energy of the valence band between SrTiO₃ and LaCoO₃ was 3.0 eV.

The p-type film 1 is not limited to a LaCoO₃ film and may be, for example, a $Sr_aLa_{1-a}CoO_3$ film (0≤a≤0.5) or a $Ca_bLa_{1-b}CoO_3$ film (0≤b≤0.5). The n-type film 2 is not limited to a $Sr_{0.95}La_{0.05}TiO_3$ film and may be, for example, a $Sr_{1-c}La_cTiO_3$ film (0.01≤c≤5) or a $SrTi_{1-d}Nb_dO_3$ film (0.01≤d≤0.5). The barrier film 5 is not limited to a SrZrO₃ film and may be a $SrZr_{1-e}Ti_eO_3$ film (0≤e≤0.8). The p-type film 1 may be constituted by a plurality of sublayers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A thermoelectric conversion element comprising:
   a p-type film having a perovskite structure, the p-type film including Co;

an n-type film having a perovskite structure, the n-type film including Ti;
first and second i-type films arranged to face each other on opposite sides of the n-type film, the first and second i-type films having a perovskite structure and including Ti;
a first barrier film interposed between the first i-type film and the p-type film; and
a second barrier film and a third barrier film arranged to sandwich the p-type film, the first barrier film, the first i-type film, the n-type film, and the second i-type film therebetween, wherein
the second barrier film and the p-type film are in direct physical contact, the p-type film and the first barrier film are in direct physical contact, the first barrier film and the first i-type film are in direct physical contact, the first i-type film and the n-type film are in direct physical contact, the n-type film and the second i-type film are in direct physical contact, and the second i-type film and the third barrier film are in direct physical contact, and wherein
the first, second, and third barrier films have a perovskite structure including Zr.

2. The thermoelectric conversion element according to claim 1,
wherein the p-type film is a $Sr_aLa_{1-a}CoO_3$ film ($0 \leq a \leq 0.5$) or a $Ca_bLa_{1-b}CoO_3$ film ($0 \leq b \leq 0.5$).

3. The thermoelectric conversion element according to claim 1,
wherein the first, second, and third barrier films are each a $SrZr_{1-e}Ti_eO_3$ film ($0 \leq e \leq 0.8$).

4. The thermoelectric conversion element according to claim 2,
wherein the first, second, and third barrier films are each a $SrZr_{1-e}Ti_eO_3$ film ($0 \leq e \leq 0.8$).

5. The thermoelectric conversion element according to claim 1,
wherein the n-type film is a $Sr_{1-c}La_cTiO_3$ film ($0.01 \leq c \leq 0.5$) or a $SrTi_{1-d}Nb_dO_3$ film ($0.01 \leq d \leq 0.5$).

6. The thermoelectric conversion element according to claim 2,
wherein the n-type film is a $Sr_{1-c}La_cTiO_3$ film ($0.01 \leq c \leq 0.5$) or a $SrTi_{1-d}Nb_dO_3$ film ($0.01 \leq d \leq 0.5$).

7. The thermoelectric conversion element according to claim 3,
wherein the n-type film is a $Sr_{1-c}La_cTiO_3$ film ($0.01 \leq c \leq 0.5$) or a $SrTi_{1-d}Nb_dO_3$ film ($0.01 \leq d \leq 0.5$).

8. The thermoelectric conversion element according to claim 1,
wherein the first and second i-type films are $SrTiO_3$ films.

9. The thermoelectric conversion element according to claim 2,
wherein the first and second i-type films are $SrTiO_3$ films.

10. The thermoelectric conversion element according to claim 3,
wherein the first and second i-type films are $SrTiO_3$ films.

11. The thermoelectric conversion element according to claim 5,
wherein the first and second i-type films are $SrTiO_3$ films.

12. A method for producing a thermoelectric conversion element, the method comprising:
forming a p-type film having a perovskite structure, the p-type film including Co;
forming an n-type film having a perovskite structure, the n-type film including Ti;
forming first and second i-type films having a perovskite structure and including Ti, the first and second i-type films being arranged to face each other on opposite sides of the n-type film;
forming a first barrier film interposed between the first i-type film and the p-type film; and
forming a second barrier film and a third barrier film arranged to sandwich the p-type film, the first barrier film, the first i-type film, the n-type film, and the second i-type film therebetween, wherein
the second barrier film and the p-type film are in direct physical contact, the p-type film and the first barrier film are in direct physical contact, the first barrier film and the first i-type film are in direct physical contact, the first i-type film and the n-type film are in direct physical contact, the n-type film and the second i-type film are in direct physical contact, and the second i-type film and the third barrier film are in direct physical contact, and wherein
the first, second, and third barrier films have a perovskite structure including Zr.

13. The method for producing a thermoelectric conversion element according to claim 12,
wherein the p-type film is a $Sr_aLa_{1-a}CoO_3$ film ($0 \leq a \leq 0.5$) or a $Ca_bLa_{1-b}CoO_3$ film ($0 \leq b \leq 0.5$).

14. The thermoelectric conversion element according to claim 12,
wherein the first, second and third barrier films are each a $SrZr_{1-e}Ti_eO_3$ film ($0 \leq e \leq 0.8$).

15. The thermoelectric conversion element according to claim 13,
wherein the first, second, and third barrier films are each a $SrZr_{1-e}Ti_eO_3$ film ($0 \leq e \leq 0.8$).

16. The method for producing a thermoelectric conversion element according to claim 12,
wherein the n-type film is a $Sr_{1-c}La_cTiO_3$ film ($0.01 \leq c \leq 0.5$) or a $SrTi_{1-d}Nb_dO_3$ film ($0.01 \leq d \leq 0.5$).

17. The method for producing a thermoelectric conversion element according to claim 13,
wherein the n-type film is a $Sr_{1-c}La_cTiO_3$ film ($0.01 \leq c \leq 0.5$) or a $SrTi_{1-d}Nb_dO_3$ film ($0.01 \leq d \leq 0.5$).

18. The method for producing a thermoelectric conversion element according to claim 14,
wherein the n-type film is a $Sr_{1-c}La_cTiO_3$ film ($0.01 \leq c \leq 0.5$) or a $SrTi_{1-d}Nb_dO_3$ film ($0.01 \leq d \leq 0.5$).

19. The method for producing a thermoelectric conversion element according to claim 12,
wherein the first and second i-type films are $SrTiO_3$ films.

20. A thermoelectric conversion apparatus comprising:
a thermoelectric conversion element including:
a p-type film having a perovskite structure, the p-type film including Co;
an n-type film having a perovskite structure, the n-type film including Ti;
first and second i-type films arranged to face each other on opposite sides of the n-type film, the first and second i-type films having a perovskite structure and including Ti; and
a first barrier film interposed between the first i-type film and the p-type film;
a second barrier film and a third barrier film arranged to sandwich the p-type film, the first barrier film, the first i-type film, the n-type film, and the second i-type film therebetween; and
a conductive film with which the p-type film and the n-type film are electrically coupled to each other, wherein the second barrier film and the p-type film are in direct physical contact, the p-type film and the first barrier film are in direct physical contact, the first barrier film and the first i-type film are in direct physical contact, the first i-type film and the n-type film are in direct physical contact, the n-type film and the second i-type film are in direct physical contact, and the second i-type film and the third barrier film are in direct physical contact, and wherein the first, second, and third barrier films have a perovskite structure including Zr.

\* \* \* \* \*